United States Patent [19]

Luyten

[11] Patent Number: 4,959,612
[45] Date of Patent: Sep. 25, 1990

[54] METHOD OF HETERONUCLEAR DECOUPLING IN MAGNETIC RESONANCE SPECTROSCOPY, AND DEVICE FOR DETERMINING A SPECTRUM

[75] Inventor: Peter R. Luyten, Eindhoven, Netherlands

[73] Assignee: U.S. Philips Corporation, New York, N.Y.

[21] Appl. No.: 358,326

[22] Filed: May 26, 1989

[30] Foreign Application Priority Data

Aug. 17, 1988 [NL] Netherlands ............ 8802036

[51] Int. Cl.⁵ ............................................. G01R 33/20
[52] U.S. Cl. .................................................... 324/311
[58] Field of Search ............... 324/307, 309, 311, 313, 324/314, 308, 310

[56] References Cited

U.S. PATENT DOCUMENTS

| | | | |
|---|---|---|---|
| 3,348,137 | 10/1967 | Nelson | 324/311 |
| 4,345,207 | 8/1982 | Bertrand et al. | 324/308 |
| 4,443,761 | 4/1984 | Levitt | 324/311 |
| 4,470,014 | 9/1984 | Levitt et al. | 324/311 |
| 4,629,988 | 12/1986 | Bottomley | 324/309 |
| 4,682,106 | 7/1987 | Vatis et al. | 324/307 |

OTHER PUBLICATIONS

M. S. Silver et al, "Selective Spin Inversion in Nuclear Magnetic Resonance and Coherent Optics Through an Exact Solution of the Bloch-Riccati Equation", Physical Review A, vol. 31, no. 4, Apr. 1985, pp. 2753-2755.
T. Fujiwara et al, "Composite Inversion Pulses with Frequency Switching and Their Application to Broadband Decoupling", Journal of Magnetic Resonance, vol. 77 no. 1, Mar. 1988, pp. 57-63.
M. A. Foster and J. M. S. Hutchinson, "Practical NMR Imaging", IRL Press, 1987 pp. 1-48.

Primary Examiner—Michael J. Tokar
Assistant Examiner—Kevin D. O'Shea
Attorney, Agent, or Firm—Jack D. Slobod

[57] ABSTRACT

A method of heteronuclear decoupling in magnetic resonance spectroscopy and a device for determining a spectrum where spectra of a first type of nucleus which is spin-coupled to a second type of nucleus are decoupled inter alia in order to obtain a higher resolution. In inter alia phosphorous spectroscopy, during signal acquisition of resonance signals of the first type of nucleus, decoupling pulses are applied to the second type of nucleus, which decoupling pulses have been modulated in amplitude as well as in frequency or phase. The decoupling pulses need hardly be optimized. Very good decoupling is achieved, notably when use is made of surface coils for the transmitter and receiver coils exhibiting a substantial field inhomogeneity. When surface coils are used, suitable decoupling is achieved across a comparatively large volume.

20 Claims, 3 Drawing Sheets

METHOD OF HETERONUCLEAR DECOUPLING IN MAGNETIC RESONANCE SPECTROSCOPY, AND DEVICE FOR DETERMINING A SPECTRUM

BACKGROUND OF THE INVENTION

1. Field of the Invention

The invention relates to a method of heteronuclear decoupling in magnetic resonance spectroscopy, where magnetic resonance signals originating from a first type of nucleus in an object are generated at least by irradiating the first type of nucleus with an RF electromagnetic excitation pulse, the first type of nucleus being spin-coupled to a second type of nucleus in the object, a pulse train of inversion pulses being applied to the second type of nucleus at least during signal acquisition of the magnetic resonance signals, in order to decouple the first type of nucleus from the second type of nucleus.

The invention also relates to a device for determining a spectrum from at least one magnetic resonance signal, which device comprises means for generating a steady, uniform magnetic field, first transmitter means for transmitting RF electromagnetic excitation pulses for exciting a first type of nucleus in an object, second transmitter means for transmitting inversion pulses to a second type of nucleus in the object, said second type of nucleus being spin-coupled to the first type of nucleus, in order to decouple the first type of nucleus from the second type of nucleus, receiver means for receiving resonance signals from the object, means for generating at least one magnetic field gradient, sampling means for sampling the magnetic resonance signal, and display means for displaying the spectrum, and also comprises processing means which include programmed arithmetic means for determining the spectrum from sampling values obtained by means of the sampling means, the programmed means also being suitable for activating, at least during signal acquisition of the resonance signals, the second transmitter means in order to transmit the inversion pulses.

2. Prior Art

A method of this kind is particularly suitable for spatially localized spectroscopy or spectroscopic imaging, and can be used inter alia for in vivo $^{13}C$ and $^{31}P$ spectroscopy.

Such a method is known from U.S. Pat. No. 4,470,014. According to such a method, an object is arranged in a steady, uniform magnetic field and, in order to obtain magnetic resonance signals from a first type of nucleus, for example a $^{13}C$ isotope, RF electromagnetic excitation pulses are applied to the object via first transmitter means, which pulses have a frequency contents around the magnetic resonant frequency of the first type of nucleus. The first type of nucleus is molecularly coupled to a second type of nucleus, for example $^{1}H$ hydrogen; depending on the kind of molecule, the first type of nucleus may be spin-coupled to one or to more than one nucleus of the second type. The way of coupling in a molecule has consequences as regards a spectrum to be formed from the resonance signals, for example by Fourier transformation. A single coupling will produce a doublet in the spectrum when the second type of nucleus $^{1}H$, which means that two resonance peaks will occur for the relevant molecule. This is due to a nuclear spin ½ of hydrogen (spin up or spin down), so that part of the nuclear spin population of the second type of nucleus in the relevant module will experience a chemical environment which is slightly different from that experienced by a complementary, substantially identical part. The magnetic resonant frequency of the parts, therefore, will differ slightly. Multiple coupling will give rise to multiplets in the spectrum. In order to obtain a higher resolution and a higher signal-to-noise ratio, during signal acquisition of the magnetic resonance signals, the nuclei of the second type of nucleus in the known method are irradiated, using second transmitter means, with a pulse train of inversion pulses having a frequency contents around the magnetic resonant frequency of the second type of nucleus. The inversion pulses are composite pulses having a varying phase pattern. For the conditions in which decoupling of the nuclei of the first and the second type is realized, reference is made to said United States Patent Specification. As a result of decoupling, a doublet or a multiplet in a non-decoupled spectrum will appear as a single resonance peak in the decoupled spectrum, the intensity thereof being the sum of intensities of individual peaks. The spectrum obtains a higher resolution, which means that various molecules having the first type of nucleus can be distinguished better and that the signal-to-noise ratio is higher. Inter alia in the case of spatially localized spectroscopy, where within the object a volume part is selected for which a spectrum is determined, in order to achieve suitable decoupling across the entire volume of importance it is necessary that the inversion pulses are homogeneous, which means that the strength of the RF electromagnetic field should be substantially the same throughout the transmitter coil. For example, when use is made of second transmitter means which include a transmitter coil around a head of the object or a transmitter coil around the entire object, said homogeneity requirement will usually be satisfied. When use is made of a surface coil, only locally delivering a field of sufficient strength, the required uniform sensitivity pattern will usually not be achieved. In that case the inversion pulses in accordance with the known method are not capable of achieving suitable decoupling across the entire sensitivity range of the coil. Even for nuclei such as phosphor where the very near $^{31}P$-$^{1}H$ coupling (5-10 Hz) starts to play a dominant rôle as regards resolution of the spectrum at a comparatively low field strength (1.5 T), it is necessary to achieve population inversion over a non-uniform sensitivity pattern.

SUMMARY OF THE INVENTION

It is one of the objects of the invention to provide a method of heteronuclear decoupling which is extremely insusceptible to inhomogeneities in the decoupling field.

To achieve this, a method in accordance with the invention is characterized in that the inversion pulses are pulses modulated in amplitude as well as in frequency or phase. Thus, very good decoupling is achieved. Furthermore, no severe requirements are imposed as regards the optimization of the inversion pulses. The amplitude and frequency-modulated pulses are also referred to as adiabatic fast passage pulses; inversion is achieved via a frequency sweep.

A version of a method in accordance with the invention is characterized in that the amplitude modulation follows a sech function, the frequency modulation following a tanh function. It has been found that such inversion pulses offer optimum decoupling. Pulses of this kind are also referred to as hyperbolic secant frequency-modulated inversion pulses and are described in the article "Selective spin inversion in nuclear magnetic resonance and coherent optics through an exact solution of the Bloch-Riccati equation" by M. S. Silver et al, Physical Review A, Vol. 31, No. 4, Apr. 1985, pp. 2753-2755.

A version of a method in accordance with the invention is characterized in that the pulse power of the inversion pulses exceeds a predetermined threshold value. For the entire sensitivity range of the coil the principle of the adiabetic passage must be satisfied. It has been found that the decoupling field always produces 180° inversion when the threshold value is chosen to be high enough. However, the threshold value should not be chosen to be too high. Even through the so-called J coupling constants are small enough in the case of $^{31}$P-$^{1}$H to permit a comparatively low repetition frequency of the inversion pulses, a safety standard could be violated when the pulse power is too high during in vivo spectroscopy. For example, local spectroscopy is subject to a safety standard of 4 W/kg.

A version of a method in accordance with the invention is characterized in that the first type of nucleus is irradiated with a first surface coil, the second type of nucleus being irradiated with a second surface coil. Decoupling is achieved across the entire sensitivity range of the second surface coil.

A version of a method in accordance with the invention is characterized in that the magnetic resonance signals are selected from a volume part of the object. When a localization diagram is used as ISIS for selection of the volume part with frequency-modulated excitation pulses and inversion pulses applied by means of a surface coil, it has been found that the method in accordance with the invention is insusceptible to inhomogeneities in the field for the first type of nucleus as well as in that for the second type of nucleus. For a detailed description of ISIS, reference is made to U.S. Pat. No. 4,714,883.

BRIEF DESCRIPTION OF THE DRAWING

The invention will be described in detail hereinafter with reference to a drawing; therein.

DETAILED DESCRIPTION OF THE PREFERRED EMBODIMENTS

Figure 1:
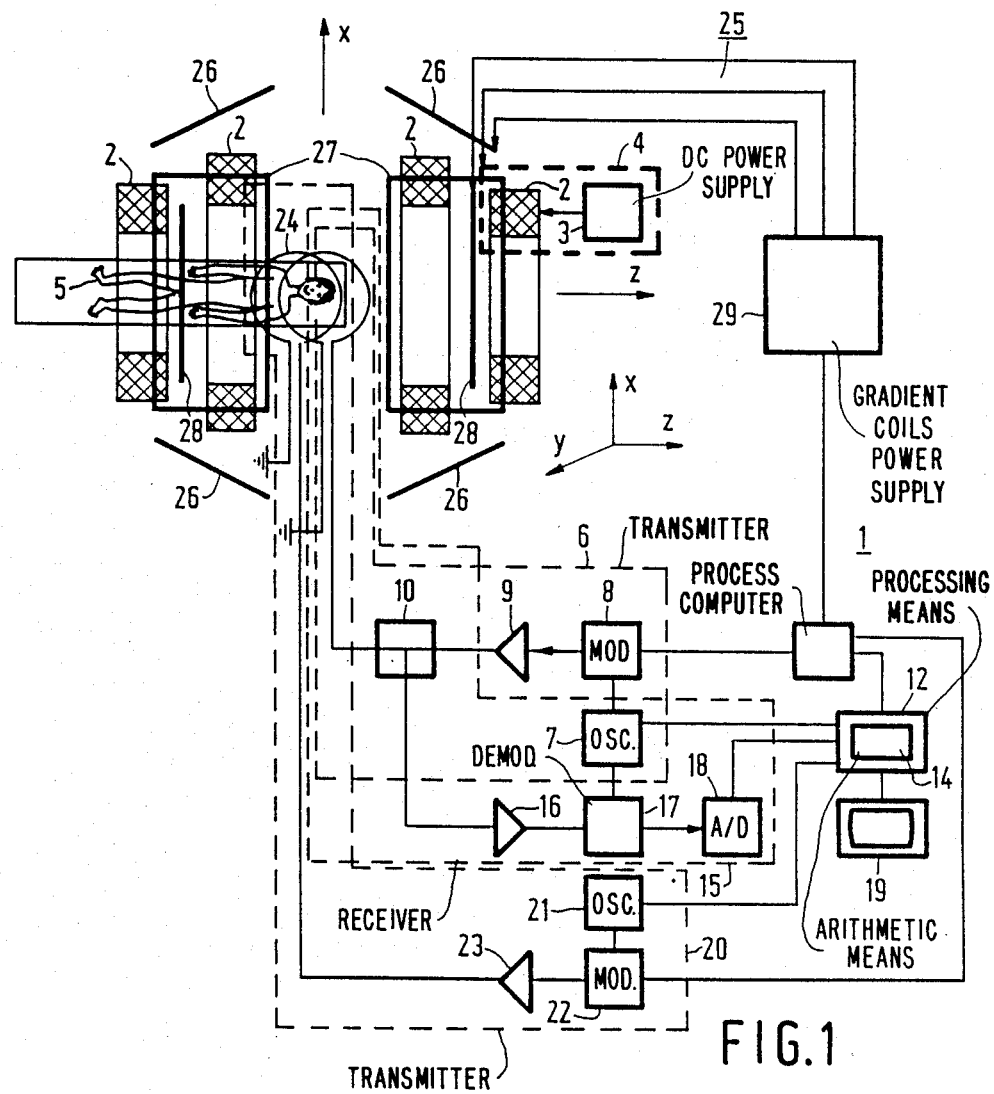
FIG. 1 diagrammatically shows a device in accordance with the invention.

FIG. 1 diagrammatically shows a device 1 in accordance with the invention. The device 1 comprises magnet coils 2 and, in the case of resistance magnets or superconducting magnets, a dc power supply source 3. The magnet coils 2 and the dc power supply source 3 constitute means 4 for generating a steady, uniform magnetic field which may have a strength of, for example 1.5 T. When the magnet coils 2 are constructed as permanent magnets, the dc power supply source 3 is omitted. Inside the magnet coils 2 there can be arranged an object 5. The object 5 may contain a first type of nucleus which is spin-coupled to a second type of nucleus. During in vivo phosphor spectroscopy, the object may contain, for example 2,3 diphosphoglycerate, phosphoethanolamine, phosphocholine, glycerophosphoethenolamine, glycerophosphocholine and alpha ATP, in which $^{31}$P nuclei are coupled to one or more protons. The coupling can be expressed by means of a coupling constant J sec$^{-1}$. During operation of the device 1, the object 5 being arranged within the magnet coils 2, a slight excess of nuclear spins (of nuclei having a magnetic moment) will be oriented in the direction of the steady uniform magnetic field in the state of equilibrium. From a macroscopic point of view this may be considered as a magnetization M, being an equilibrium magnetization. The device 1 also comprises first transmitter means 6 for transmitting RF electromagnetic excitation pulses in order to excite a first type of nucleus, for example $^{31}$P in the object 5. The first transmitter means 6 comprise an oscillator 7 for generating a carrier signal, a modulator 8 for amplitude and/or phase or frequency modulation of the carrier signal, an amplifier 9, and a directional coupler 10 which is coupled to a first coil 11 for transmitting RF electromagnetic pulses and for receiving magnetic resonance signals. The coil 11 may be a coil which encloses the entire object, a coil which encloses a part of the object, or a surface coil. The oscillator 7 is coupled to processing means 12 and the modulator 8 is coupled to a process computer 13 which is coupled to the processing means 12. The processing means 12 comprise programmed arithmetic means 14. When excitation pulses having a frequency contents around the magnetic resonance of, for example $^{31}$P as the first type of nucleus are applied to the object by the first transmitter means 6 under the control of the programmed means, magnetic resonance signals will arise. For 1.5 T this will be a frequency range around 25 MHz. The device 1 comprises receiver means 15 for receiving the magnetic resonance signals from the object 5, which receiver means comprise the oscillator 7, the directional coupler 10 and the coil 11, and also comprise an amplifier 16, a demodulator 17 which is, for example a phase-sensitive detector, and an A/D converter (sampling means) 18 which performs a signal sampling operation on the demodulated magnetic resonance signal. Usually quadrature detection takes place. There is provided another A/D converter then (not shown). The A/D converter applies digital sampling values to the processing means 12. The programmed arithmetic means 14 determine, using a Fourier transformation algorithm, a spectrum or a spectroscopic image from the sampling values. The device 1 comprises display means 19 for displaying the spectrum or the spectroscopic image. The device 1 also comprises second transmitter means 20 which include an oscillator 21 for generating a carrier signal, a modulator 22 for amplitude and frequency or phase modulation of the carrier signal, an amplifier 23 and a coil 24. Via the second transmitter means, inversion pulses can be applied to the second type of nucleus in order to decouple the first and the second type of nucleus. The coil 24 may be a coil which encloses the entire object, a coil which encloses a part of the object 5, or a surface coil. The device 1 also comprises means 25 for generating magnetic field gradients which are superposed on the steady, uniform magnetic field. The means 25 comprise gradient magnet coils 26 for generating a magnetic field gradient $G_x$, gradient magnet coils 27 for generating a magnetic field gradient $G_y$, gradient magnet coils 28 for generating a magnetic field gradient $G_z$, and a power supply 29 which can be activated by the process computer 13 in order to power the gradient magnet coils 26, 27 and 28 which can be separately activated. In the embodiment shown, the arrangement in space of the gradient magnet coils is such that the field direction of the magnetic field gradients $G_x$, $G_y$ and $G_z$ coincides with the direction of the steady, uniform magnetic field, the gradient directions extending perpendicularly to one another as denoted by three mutually perpendicular axes x, y and z in FIG. 1. For a more general description of an NMR device and a general description of the principles of NMR, reference is made to the handbook "Practical NMR imaging" by M. A. Foster and J. M. S. Hutchinson, pp. 1–48, 1987, IRL Press Ltd.

Figure 2:
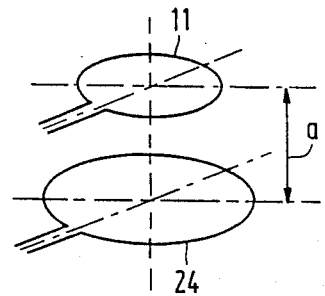
FIG. 2 shows a surface coil configuration.

FIG. 2 shows a surface coil configuration for use in the device 1; there are shown a surface coil 11 for coupling to the directional coupler 10 and a surface coil 24 for coupling to the amplifier 23. In the case of phosphor spectroscopy use is made of a surface coil 11 having a diameter of 14 cm for irradiation of the first type of nucleus, a surface coil 24 having a diameter of 16 cm being used for irradiating the second type of nucleus $^1H$ with frequency-modulated adiabetic fast passage pulses for the decoupling of $^{31}P$ and $^1H$. The coils 11 and 24 are arranged in parallel planes so as to be concentric with respect to one another at a distance a of 3 cm. During the measurement of the resonance signals, the coil 24 will be situated 3 cm further from the object than the coil 11 in order to prevent an excessive RF power from being applied to the object at high-flux areas near the coil 24.

Figure 3:
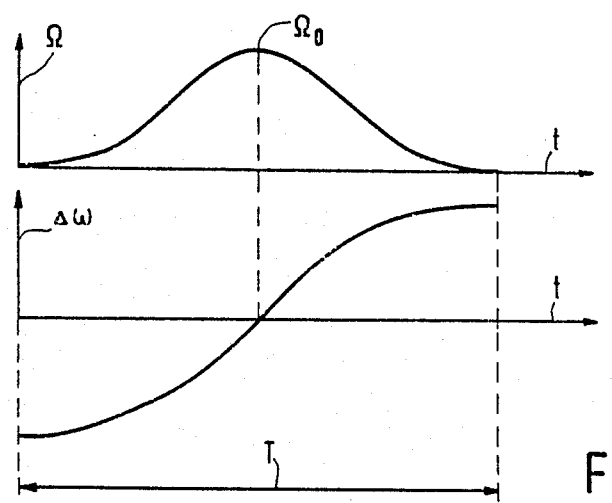
FIG. 3 shows a hyperbolic secant frequency-modulated inversion pulse.

FIG. 3 shows a hyperbolic secant frequency-modulated inversion pulse, i.e. a pulse whose amplitude $\Omega$ as a function of time t satisfies $\Omega=\Omega_0 \text{sech}(\beta t)$, the frequency sweep being $\Delta\omega=\mu\beta\tanh(t)$, where $\Omega_0$ is the maximum amplitude and $\mu$ and $\beta$ are constants. Excellent decoupling is achieved by means of inversion pulses having a duration T of 8 ms, corresponding to a spectral width of approximately 600 Hz around a central resonant frequency in a proton spectrum (10 ppm of 60 MHz for a strength of 1.5 T of the steady uniform magnetic field). The inversion should be fast with respect to the splitting (for example, a doublet); two magnetizations of the doublet which are to be considered as a vector will then alternately move towards and away from one another in a coordinate system rotating at the phosphor resonant frequency, but effectively they will not be dephased. The decoupling field B is subject to the conditions $B>(2\pi J)/\text{gamma}$ and $B>(2\pi.\text{bandwidth proton spectrum})/\text{gamma}$, where gamma is the gyroscopic ratio of protons.

Figure 4:
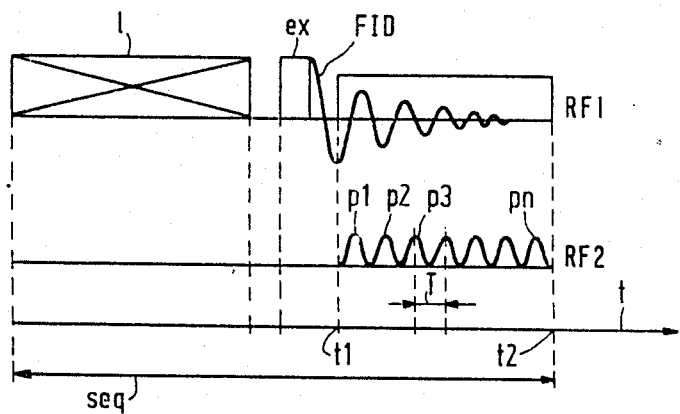
FIG. 4 shows a first version of heteronuclear decoupling in accordance with the invention.

FIG. 4 shows a first version of a heteronuclear decoupling in accordance with the invention, in which resonance signals are obtained from spatially localized spectroscopy. Using a localization diagram 1, a volume part in the object 5 is localized, for example by means of a localization diagram as said ISIS. ISIS combines gradients $G_x$, $G_y$ and $G_z$ in groups of 8 resonance signals. The gradients coincide with selective 180° pulses. For a more elaborate description of ISIS (Image-Selected In Vivo Spectroscopy), reference is made to said U.S. Pat. No. 4,714,883. Via the first transmitter means 6, the selective pulses are applied to, for example $_{31}p$. Subsequently, the first transmitter means 6 apply an excitation pulse ex (see line RF1 in FIG. 4) to the first type of nucleus, with the result that a magnetic resonance signal FID is generated. Using the sampling means, samples of the signal FID are taken at the instants from t1 to t2. In accordance with the invention, during signal sampling pulses p1, p2, p3, . . . pn (see line RF2 in FIG. 4) are applied to the second type of nucleus via the second transmitter means 20, which pulses are modulated as regards amplitude as well as regards frequency or phase. A sequence seq has a duration of, for example 3 s and the distance in time t1–t2 amounts to, for example 256 ms, the pulse duration T being 8 ms. In order to achieve suitable decoupling by means of said surface coil configuration, a peak power of more than 140 W is required for the decoupling field. This results in a mean power of 3.5 W, which is within said safety limit. Even though uncoupling pulses could also be applied to the second type of nucleus during localization in order to achieve a so-called Nuclear Overhauser Effect (NOE), resulting in an even stronger resonance signal, in the present example the safety limit for in vivo spectrocopy would then be violated. In order to achieve an adequate signal-to-noise ratio, it is necessary to average a large number of resonance signals; for example, for an in vivo liver spectrum 280 signals were averaged. When more isolated areas of an object are scanned, for example a calf of a leg, volume selection can be dispensed with.

Figure 5A:
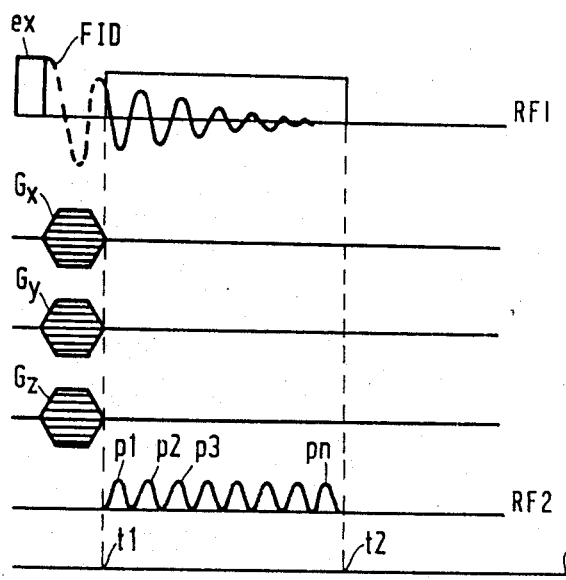
FIG. 5A shows a second version of a method in accordance with the invention.

FIG. 5A illustrates a second version of a method in accordance with the invention. It shows an acquisition diagram for spectroscopic imaging as a function of the time t. After an excitation pulse ex (see line RF1 in FIG. 5B), which rotates the magnetization M of, for example $^{31}P$ through a predetermined angle, via the first transmitter means 6, and which generates a magnetic resonance signal FID, gradients $G_x$, $G_y$ and $G_z$ are applied by means of the means 25. The angle may be 90° or less. During signal acquisition from t1 to t2, via the second transmitter means 20 inversion pulses p1, p2, p3, . . . pn (see line RF2 in FIG. 5B) in accordance with the invention are applied to the second type of nucleus. This sequence is repeated while varying the strength of the gradients $G_x$, $G_y$ and $G_z$, so that nuclear spins are phase encoded in a volume part as in conventional imaging sequences. The phase at locations along a gradient varies, and phase encoding occurs. During signal acquisition, no gradients are applied so that the spin presessional frequency depends only on chemical shifts. The resonance signal represents the chemical shifts. After Fourier transformation, location-dependent spectra are obtained. When a given frequency range is isolated from the spectra, for example corresponding to PCr (phosphorous creatine) and when the values of the PCr spectral peaks (surface areas below the peak) are determined and displayed as grey values or as colour tones, for example for a slice of voxels (volume elements), a spectroscopic image is obtained. Decoupling ensures adequate resolution in the spectra to enable such images, to be formed.

Figure 5B:
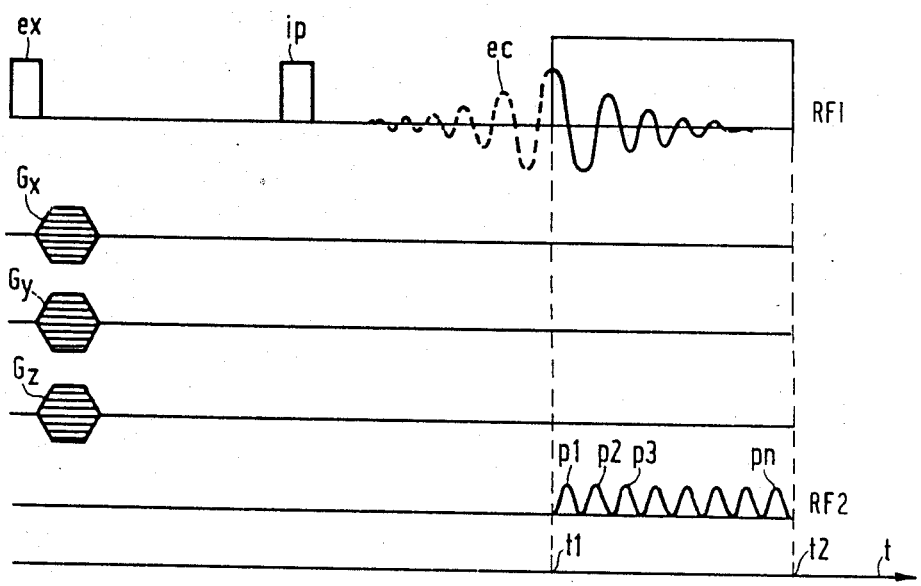
FIG. 5B shows a third version of a method in accordance with the invention.

FIG. 5B shows a third version of a method in accordance with the invention, which version substantially corresponds to the version shown in FIG. 5A. Corresponding symbols and variables are denoted by corresponding references. The acquisition diagram is based on the known spin echo method: a 90° excitation pulse ex, a 180° inversion pulse ip and a resonance signal ec. The gradients are applied between the pulses ex and ip and the decoupling pulses are applied during signal acquisition from t1 to t2.

I claim:

1. A method of heteronuclear decoupling in magnetic resonance spectroscopy, where magnetic resonance signals originating from a first type of nucleus in an object are generated at least by irradiating the first type of nucleus with an RF electromagnetic excitation pulse, the first type of nucleus being spin-coupled to a second type of nucleus in the object, a pulse train of inversion pulses being applied to the second type of nucleus, at least during signal acquisition of the magnetic resonance signals, in order to decouple the first type of nucleus from the second type of nucleus, characterized in that the inversion pulses are pulses modulated in amplitude as well as in frequency or phase.

2. A method as claimed in claim 1, characterized in that the amplitude modulation follows a sech function, the frequency modulation following a tanh function.

3. A method as claimed in claim 1, characterized in that the amplitude modulation follows a sech function, the phase modulation following the integral of a tanh function.

4. A method as claimed in claim 1, characterized in that the pulse power of the inversion pulses exceeds a predetermined threshold value.

5. A method as claimed in claim 1, characterized in that the first type of nucleus is a $^{31}P$ phosphorous isotope, the second type of nucleus being $^1H$ hydrogen.

6. A method as claimed in claim 1, characterized in that the first type of nucleus is irradiated with a first surface coil, the second type of nucleus being irradiated with a second surface coil.

7. A method as claimed in claim 1, characterized in that the magnetic resonance signals are selected from a volume part of the object.

8. A device for determining a spectrum from at least one magnetic resonance signal, which device comprises means for generating a steady, uniform magnetic field, first transmitter means for transmitting RF electromagnetic excitation pulses for exciting a first type of nucleus in an object, second transmitter means for transmitting inversion pulses to a second type of nucleus in the object, said second type of nucleus being spin-coupled to the first type of nucleus, in order to decouple the first type of nucleus from the second type of nucleus, receiver means for receiving resonance signals from the object, means for generating at least one magnetic field gradient, sampling means for sampling the magnetic resonance signal and display means for displaying the spectrum, and also comprises processing means which include programmed arithmetic means for determining the spectrum from sampling values obtained by means of the sampling means, the programmed means also being suitable for activating, at least during signal acquisition of the resonance signals, the second transmitter means in order to transmit the inversion pulses, characterized in that the programmed means are also suitable for controlling the second transmitter means so that the inversion pulses are pulses modulated in amplitude as well as in frequency or phase.

9. A method as claimed in claim 2, characterized in that the first type of nucleus is a $^{31}p$ phosphor isotope, the second type of nucleus being $^1H$ hydrogen.

10. A method as claimed in claim 3, characterized in that the first type of nucleus is a $^{31}P$ phosphorous isotope, the second type of nucleus being $^1H$ hydrogen.

11. A method as claimed in claim 4, characterized in that the first type of nucleus is a $^{31}P$ phosphorous isotope, the second type of nucleus being $^1H$ hydrogen.

12. A method as claimed in claim 2, characterized in that the first type of nucleus is irradiated with a first surface coil, the second type of nucleus being irradiated with a second surface coil.

13. A method as claimed in claim 3, characterized in that the first type of nucleus is irradiated with a first surface coil, the second type of nucleus being irradiated with a second surface coil.

14. A method as claimed in claim 9, characterized in that the first type of nucleus is irradiated with a first surface coil, the second type of nucleus being irradiated with a second surface coil.

15. A method as claimed in claim 10, characterized in that the first type of nucleus is irradiated with a first surface coil, the second type of nucleus being irradiated with a second surface coil.

16. A method as claimed in claim 2, characterized in that the magnetic resonance signals are selected from a volume part of the object.

17. A method as claimed in claim 3, characterized in that the magnetic resonance signals are selected from a volume part of the object.

18. A method as claimed in claim 5, characterized in that the magnetic resonance signals are selected from a volume part of the object.

19. A method as claimed in claim 14, characterized in that the magnetic resonance signals are selected from a volume part of the object.

20. A method as claimed in claim 15, characterized in that the magnetic resonance signals are selected from a volume part of the object.

* * * * *